US006807657B2

(12) United States Patent
Frank et al.

(10) Patent No.: US 6,807,657 B2
(45) Date of Patent: Oct. 19, 2004

(54) INTER-SIGNAL PROXIMITY VERIFICATION IN AN INTEGRATED CIRCUIT

(75) Inventors: Mark D. Frank, Longmont, CO (US); Jerimy Nelson, Ft. Collins, CO (US); Peter Shaw Moldauer, Wellington, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 17 days.

(21) Appl. No.: 10/199,331

(22) Filed: Jul. 19, 2002

(65) Prior Publication Data

US 2004/0015806 A1 Jan. 22, 2004

(51) Int. Cl.[7] .............................................. G06F 17/50
(52) U.S. Cl. ................................ 716/5; 716/4; 716/11; 703/15
(58) Field of Search ........................... 703/15; 702/189; 324/763, 537, 536; 716/1, 2, 4, 5, 6, 7, 8, 10, 11, 13, 18; 714/739, 738, 726

(56) References Cited

U.S. PATENT DOCUMENTS

| 5,383,132 | A | 1/1995 | Shinohara et al. ........... 364/491 |
| 5,481,695 | A | 1/1996 | Purks .......................... 395/500 |
| 5,510,998 | A | 4/1996 | Woodruff et al. ........... 364/489 |
| 5,559,718 | A | 9/1996 | Baisuck et al. ............. 364/491 |
| 5,590,049 | A | 12/1996 | Arora .......................... 364/489 |
| 5,663,891 | A | 9/1997 | Bamji et al. ................. 364/490 |
| 5,729,466 | A | 3/1998 | Bamji .......................... 364/488 |
| 5,896,300 | A | 4/1999 | Raghavan et al. ........... 364/491 |
| 5,953,518 | A | 9/1999 | Sugasawara et al. ........ 395/500 |
| 6,182,258 | B1 | 1/2001 | Hollander .................... 714/739 |
| 6,282,693 | B1 | 8/2001 | Naylor et al. ................... 716/8 |
| 6,301,693 | B1 | 10/2001 | Naylor et al. ................. 716/10 |
| 6,311,318 | B1 | 10/2001 | Souef et al. .................. 716/18 |
| 6,324,675 | B1 | 11/2001 | Dutta et al. ................... 716/13 |
| 6,336,206 | B1 | 1/2002 | Lockyear ....................... 716/7 |
| 6,363,520 | B1 | * | 3/2002 | Boubezari et al. ............ 716/18 |
| 6,499,129 | B1 | * | 12/2002 | Srinivasan et al. ............ 716/4 |
| 6,581,196 | B2 | * | 6/2003 | Eisenberg et al. ............. 716/5 |
| 2001/0010090 | A1 | 7/2001 | Boyle et al. ................... 716/2 |
| 2001/0011903 | A1 | * | 8/2001 | O'Neill et al. ............... 324/763 |
| 2001/0016933 | A1 | 8/2001 | Chang et al. .................. 716/1 |
| 2001/0052107 | A1 | 12/2001 | Anderson et al. .............. 716/4 |
| 2002/0004931 | A1 | 1/2002 | Stralen ......................... 716/18 |

OTHER PUBLICATIONS

"Alternate Verilog FAQ," Version 9.13, http://www.angelfire.com/in/verilogfaq/index.html (Jun. 2001).

(List continued on next page.)

*Primary Examiner*—Matthew Smith
*Assistant Examiner*—Helen Rossoshek

(57) ABSTRACT

In one aspect, techniques are disclosed for identifying and notifying a circuit designer of signal traces in an integrated circuit design that are closer to each other than a proximity threshold. It is desirable that signal traces be separated from each other by at least the proximity threshold to reduce inter-signal crosstalk to an acceptable level. Such notification may occur either dynamically (while the circuit designer is designing the circuit) or through a report generated after the circuit design has been generated. In another aspect, techniques are disclosed for identifying and notifying the circuit designer of the signal traces that are closest to a reference signal trace. Such notification may provide the circuit designer with feedback about regions in the circuit design which are congested and which may therefore produce an unacceptable level of crosstalk.

66 Claims, 9 Drawing Sheets

OTHER PUBLICATIONS

"Advanced Package Designer," Cadence Design Systems, Inc. (2000).

"Advanced Package Engineer," Cadence Design Systems, Inc. (2000).

"What's New in IC Packaging," Cadence Design Systems, Inc. (2000).

"Allegro Designer/Allegro Expert," Cadence Design Systems, Inc. (2001).

"Pacific Numerix Joint Solution With Cadence," Cadence Design Systems, Inc. (1998).

"BSDArchitect New Edition", Mentor Graphics Corporation (2000).

"FastScan V8.9_5 Enhancement Value", Mentor Graphics Corporation (2001).

"FastScan ATPG Tool Suite", Mentor Graphics Corporation (2001).

"FlexTest", Mentor Graphics Corporation (1999).

"TetraMAX ATPG Automatic Test Pattern Generation," Synopsys, Inc. (2001).

"TetraMAX ATPG High–Performance Automatic Test Pattern Generator Methodology Backgrounder," Synopsys, Inc. (1999).

* cited by examiner

US 6,807,657 B2

INTER-SIGNAL PROXIMITY VERIFICATION IN AN INTEGRATED CIRCUIT

CROSS REFERENCE TO RELATED APPLICATIONS

This application is related to the following commonly-owned and concurrently-filed patent applications, each of which is incorporated by reference herein:

application Ser. No. 10/199,127, entitled "Verifying Proximity of Ground Metal to Signal Traces in an Integrated Circuit,"; and application Ser. No. 10/199,668, entitled "Verifying Proximity of Ground Vias to Signal Vias in an Integrated Circuit,".

BACKGROUND

1. Field of the Invention

The present invention relates to integrated circuit design and, more particularly, to techniques for reducing crosstalk in an integrated circuit.

2. Related Art

Integrated circuits (ICs) are becoming increasingly large and complex, typically including millions of individual circuit elements such as transistors and logic gates. As a result of this increased size and complexity, IC designers are increasingly using electronic design automation (EDA) software tools to assist with IC design. Such tools help to manage the complexity of the design task in a variety of ways, such as by allowing ICs to be designed hierarchically, thereby enabling the design to be divided into modules and enabling the design task to be divided among multiple designers in a manner that limits the complexity faced by any one designer.

Various hardware description languages (HDLs) have been developed which allow circuit designs to be described at various levels of abstraction. A description of a circuit according to an HDL (referred to herein as an "HDL model" of the circuit) may, for example, describe a particular circuit design in terms of the layout of its transistors and interconnects on an IC, or in terms of the logic gates in a digital system. Descriptions of a circuit at different levels of abstraction may be used for different purposes at various stages in the design process. HDL models may be used for testing circuits and circuit designs, as well as for fabricating the circuits themselves. The two most widely-used HDLs are Verilog and VHDL (Very High Speed Integrated Circuits (VHSIC) Hardware Description Language), both of which have been adopted as standards by the Institute of Electrical and Electronics Engineers (IEEE). VHDL became IEEE Standard 1076 in 1987 and Verilog became IEEE Standard 1364 in 1995.

EDA tools are typically capable of converting a functional HDL description of a circuit design into a specific circuit implementation. The specific circuit implementation may be represented by a "netlist," which identifies both the elements of the circuit and the interconnections among them. In general, a netlist describes the circuit design in terms of nodes and edges. Each node represents a circuit element and each edge represents an interconnection between two circuit elements. Netlists may describe circuits at various levels of abstraction. A netlist may, for example, describe circuit elements in terms of specific structural components (such as resistors and transistors) or in terms of high-level "cells" that may be decomposed into specific structural components and/or other cells. A netlist may, for example, describe the connections between cells in terms of specific cell-to-cell pin connections.

EDA tools are typically capable of converting a netlist into a physical layout of the circuit. The layout process involves both "placement" (assigning specific coordinates in the circuit layout to each cell) and "routing" (wiring or connecting cells together). The layout produced thereby defines the specific dimensions and coordinates of the gates, interconnects, contacts, and other elements of the circuit. The layout may have multiple layers, corresponding to the layers of the circuit. The layout may be used to form a mask, which in turn may be provided to a foundry to fabricate the integrated circuit itself.

One stage in the process of IC design is package design, which refers to the design of substrates (packages) for interconnecting layers of the IC. An IC typically includes multiple packages interconnected in layers. Each package, in turn, may include multiple layers (also referred to as "planes"). Packages within a single IC may be composed of varying materials having varying electrical properties. Individual signal nets (also referred to herein simply as "nets") in the IC may be distributed across multiple packages. A package design must ensure that signals in the IC have sufficient power and maintain sufficient signal integrity when passing from one layer of the IC to another. As used herein, the term "signal net" (or simply "net") refers to a collection of conductors that are connected to form a complete circuit connecting at least one output to at least one input.

As with IC design more generally, various tools exist for automating aspects of IC package design. Such tools typically provide a graphical user interface through which package designers may visually design the IC package in three dimensions. For example, referring to FIG. 1, a prior art package design system 100 is shown in which a human package designer 116 creates and modifies a model 102 of an integrated circuit package using a package design tool 104. The package designer 116 may, for example, use a keyboard 114 or other input device to provide input 108 to the package design tool 104, in response to which the package design tool 104 may modify the package model 102 and display a graphical representation 106 of the package model 102 (or of particular layers therein) on a display monitor 112. The graphical representation 106 typically displays signal traces as lines on a two-dimensional grid.

The package model 102 may include, for example, information specifying the name, location, and size of each signal trace, ground metal, via, and other elements of the package model 102. The package model 102 is typically stored in a database file in a computer system.

One example of the package design tool 104 is Advanced Package Designer (APD), available from Cadence Design Systems, Inc. of San Jose, Calif. APD is a software program which allows the package designer 116 to model the physical, electrical, and thermal characteristics of the package substrate. An APD package design database (e.g., the package model 102) may be provided to a foundry to be used directly as manufacturing input for fabrication of the designed package.

It is common for package designs to include distinct signal layers and ground layers. For example, package model 102 includes layers 104a–c, including ground layer 104a, signal layer 104b, and ground layer 104c. Although package models typically contain additional layers, only the three layers 104a–c are shown in FIG. 1 for ease of illustration. A signal layer (such as Layer 104b) typically includes only signal traces (also referred to as signal lines), while a ground layer (such as Layer 104a or 104c) typically includes only ground metal, typically arranged either in a grid or in a solid plane. Signal layers and ground layers are often arranged so that each signal layer is located between two ground layers. It is important that there be ground metal directly above or below each signal trace in a signal layer to ensure an adequate ground return path for each signal trace.

It is also important that signal traces in the package model 102 not be too close to each other. This is referred to herein as a "minimum inter-signal spacing requirement." Closely-spaced signal traces introduce crosstalk in each other, thereby reducing signal integrity. Some package design tools do not automatically verify that signal traces are spaced sufficiently far from each other. In such cases the human package designer 116 may need to manually verify that the minimum inter-signal spacing requirement is met for all signal traces in the package model 102. This is a tedious, time-consuming, and error-prone process.

To verify that inter-signal spacing requirements are met, the package designer 116 may visually inspect the graphical representation 106. Signal traces may, for example, be graphically represented as lines on the display monitor 112. Verifying inter-signal spacing by visually inspecting the graphical package representation 106 may be difficult due to the large number and close spacing of signal traces.

Additionally or alternatively, the package design tool 104 may generate textual package property reports 110 which list various properties of the package model 102, such as the locations and lengths of signal traces in the package model 102. The package designer 116 may attempt to verify that inter-signal spacing requirements are met by inspecting the reports 110. This method, however, is also tedious, time-consuming, and difficult to perform accurately.

Some conventional package design tools automatically determine whether signal traces in the package model satisfy the inter-signal spacing requirements. Such tools, however, provide the package designer 116 with little information other than to alert the package designer 116 to the fact that one or more signal traces are too close to each other. This information may not, by itself, provide the package designer 116 with much assistance in the task of re-positioning signal traces so that they satisfy the minimum inter-signal spacing requirements. For example, upon being notified by the package design tool 104 that a signal trace is too close to at least one other signal trace, the package designer 116 must typically re-position the current signal trace manually in an attempt to satisfy the inter-signal spacing requirement by trial-and-error. This can be a tedious, time-consuming, and error-prone process.

Furthermore, the package designer 116 may wish to ensure not only that signal traces in the package model 102 satisfy the minimum inter-signal spacing requirements, but further that signal traces are separated as far apart from each other as possible to reduce crosstalk as much as possible. Conventional package design tools provide the package designer 116 with little assistance in achieving this goal, because the only spacing-related feedback that such package design tools typically provide to the package designer 116 is to alert the package designer 116 when signal traces are too close to each other.

What is needed, therefore, are improved techniques for reducing inter-signal crosstalk in an integrated circuit.

SUMMARY

In one aspect, techniques are disclosed for identifying and notifying a circuit designer of signal traces in an integrated circuit design that are closer to each other than a proximity threshold. It is desirable that signal traces be separated from each other by at least the proximity threshold to reduce inter-signal crosstalk to an acceptable level. Such notification may occur either dynamically (while the circuit designer is designing the circuit) or through a report generated after the circuit design has been generated. In another aspect, techniques are disclosed for identifying and notifying the circuit designer of the signal traces that are closest to a reference signal trace. Such notification may provide the circuit designer with feedback about regions in the circuit design which are congested and which may therefore produce an unacceptable level of crosstalk.

For example, in one aspect of the present invention, a computer-implemented method is provided that includes steps of: (A) identifying a first signal net in an integrated circuit design; (B) identifying a second signal net in the integrated circuit design; (C) determining whether at least one portion of the second signal net is within a threshold distance of the first signal net; (D) if it is determined that at least one portion of the second signal net is within the threshold distance of the first signal net, measuring the aggregate length along the first signal net that is within the threshold distance of the second signal net; (E) determining whether the measured length is at least as great as a threshold length; and (F) notifying a user that the second signal net is a neighbor of the first signal net if it is determined that the measured length is at least as great as the threshold length.

In another aspect of the present invention, a computer-implemented method is provided that includes steps of: (A) identifying a first signal net in an integrated circuit design; (B) identifying a plurality of second signal nets in the integrated circuit design; (C) identifying a subset of the plurality of second signal nets that are closest to the first signal net; and (D) notifying a user of the subset of the plurality of second signal nets.

Other features and advantages of various aspects and embodiments of the present invention will become apparent from the following description and from the claims.

DETAILED DESCRIPTION

Figure 1:
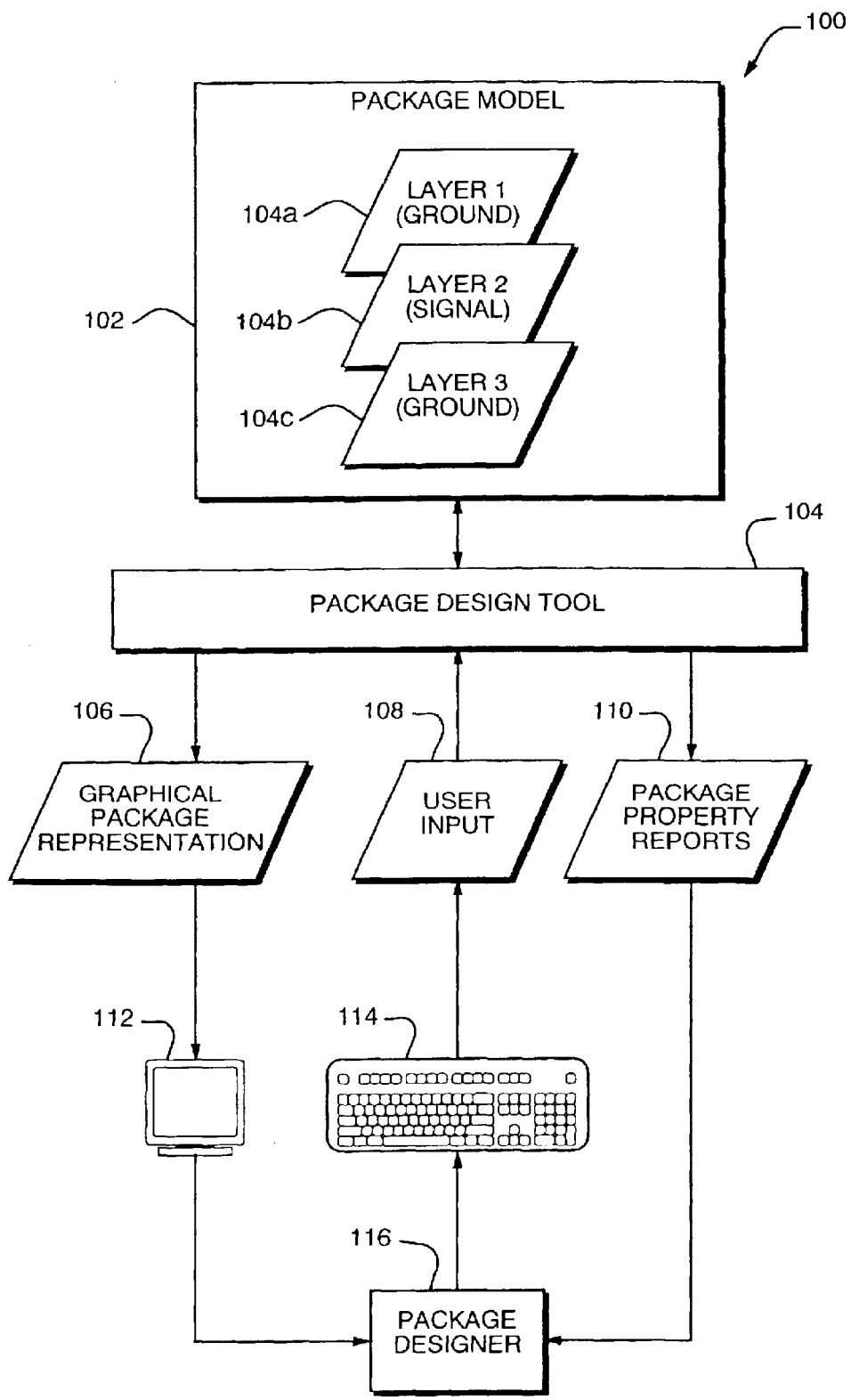
FIG. 1 is a functional block diagram of a prior art system for creating and editing a model of an integrated circuit package.
Figure 2:
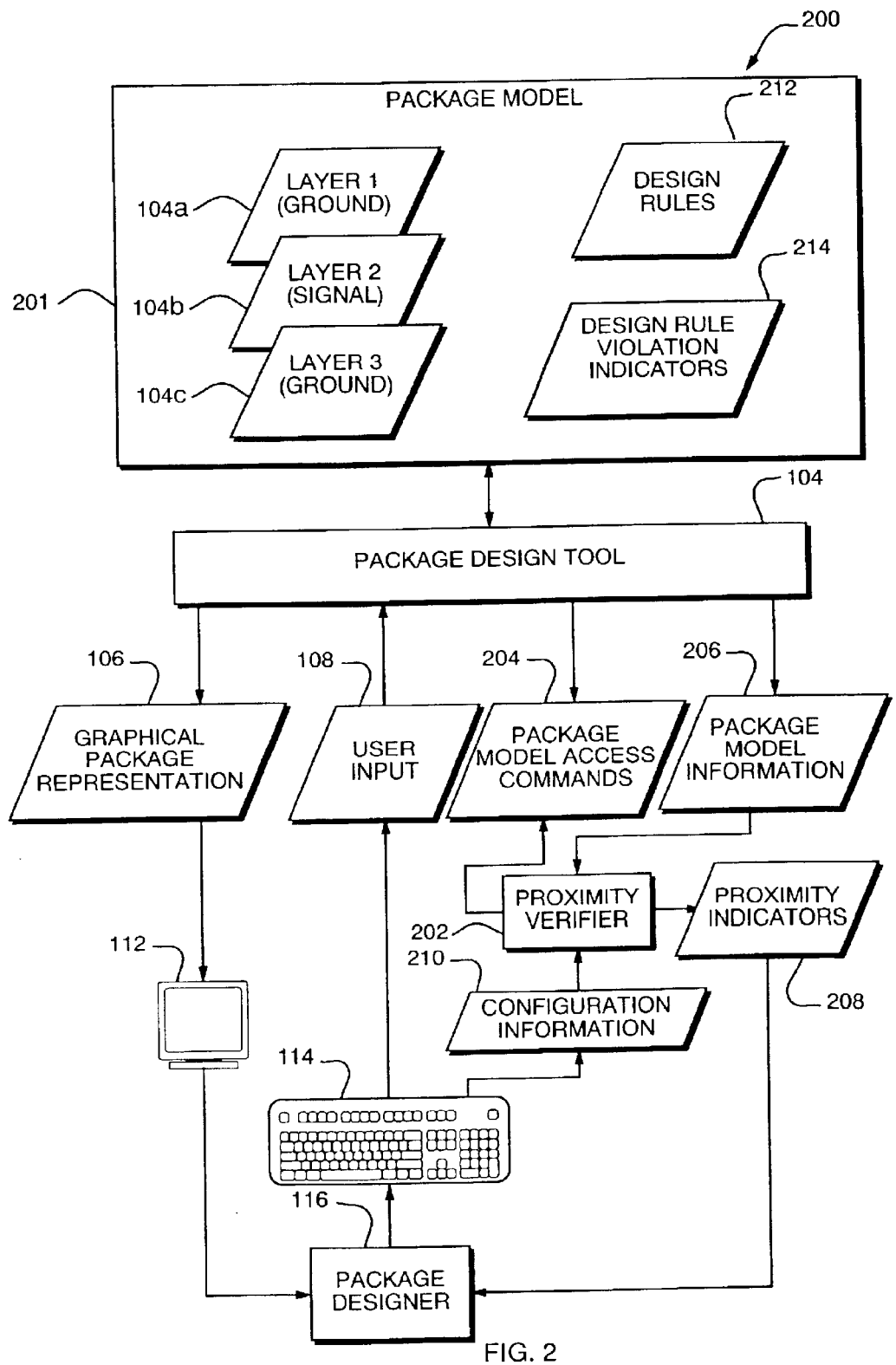
FIG. 2 is a functional block diagram of a system for verifying that signal traces in a model of an integrated circuit package satisfy minimum inter-signal spacing requirements according to one embodiment of the present invention.

Referring to FIG. 2, a functional block diagram is shown of a system 200 for verifying that signal traces in a model 201 of an integrated circuit package satisfy minimum inter-signal spacing requirements according to one embodiment of the present invention. The system 200 includes package design tool 104 (such as Advanced Package Designer), which may be a conventional package design tool as described above with respect to FIG. 1. The package designer 116 uses the package design tool 104 to create and modify package model 201 as further described above with respect to FIG. 1. The system 200 also includes a proximity verifier 202 for verifying that signal traces in the package model 201 satisfy minimum inter-signal spacing requirements. The package designer 116 instructs the proximity verifier 202 to perform verification on the package model 201. The package designer 116 may also transmit configuration information 210, containing parameters of the proximity verification process, to the proximity verifier 202.

The proximity verifier 202 transmits package model access commands 204 to the package design tool 104, in response to which the package design tool 104 transmits package model information 206 to the proximity verifier 202. The package model information 206 contains information descriptive of the package model 201, such as the locations and sizes of signal traces and ground metal in the layers 104a–c of the package model 201. The proximity verifier 202 verifies that signal traces in the package model 201 satisfy the inter-signal spacing requirements based on the package model information 206. The proximity verifier 202 generates proximity indicators 208, which indicate the results of the verification process.

In one embodiment, for example, the proximity indicators 208 indicate which points in each signal trace are closest to other signal traces in the package model 201. In another embodiment, for example, the proximity indicators 208 indicate the "neighbors," if any, of each signal trace in the package model 201. A first signal trace S1 may be a "neighbor" of a second signal trace S2 if, for example, the distance between S1 and S2 is less than a predetermined threshold distance. Furthermore, signal traces S1 and S2 may only be considered to be neighbors if, for example, the distance between S1 and S2 is less than the predetermined threshold distance for at least a predetermined minimum length along signal trace $S_1$. Examples of various techniques for measuring the distance between signal traces are provided below. The proximity indicators 208 may be generated in real-time (i.e., while the package designer 116 is editing a signal trace in the package model 201) or as a post-process (i.e., after the package designer 116 has designed the package model 201).

The proximity verifier 202 may transmit the proximity indicators 208 to the package designer 116. The package designer 116 may inspect the proximity indicators 208, and may modify the package model 201 in response to the information contained in the proximity indicators 208. The package designer 116 may, for example, re-route any indicated signal traces so that they are separated by sufficient distances from other signal traces in the package model 201.

Figure 3:
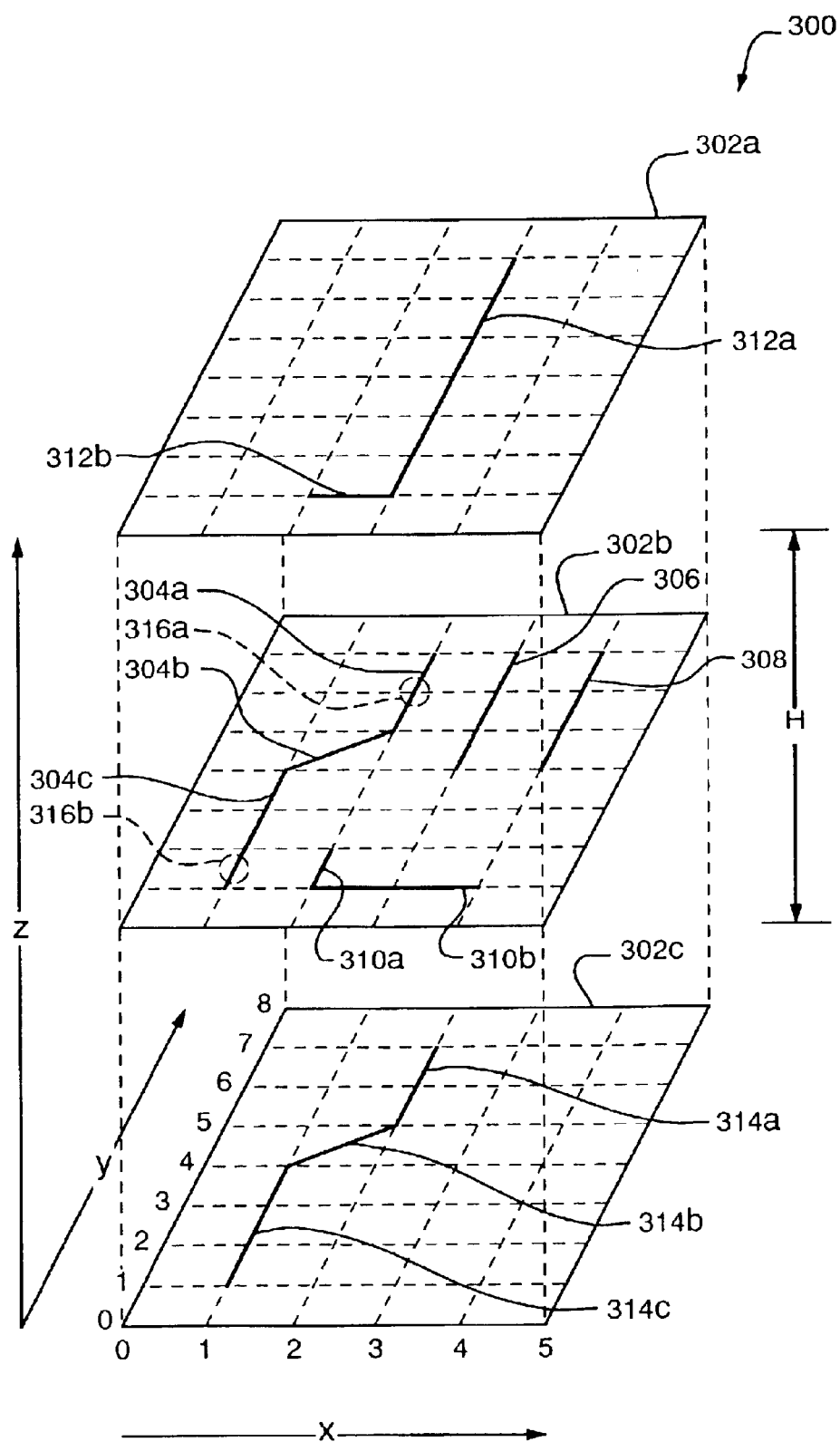
FIG. 3 is a perspective view of signal traces in three layers of an integrated circuit package according to one embodiment of the present invention.

Operation of the system 200 according to various embodiments of the present invention will now be described in more detail. First, an example will be provided which illustrates the operation of various embodiments of the present invention more clearly. Referring to FIG. 3, an example package 300 having three layers 302a–c is illustrated. The layers 302a–c may, for example, be the layers that are modeled by the layers 104a–c of the package model 201 (FIG. 2). Although package 300 has three layers 302a–c, in practice packages may have any number of layers. The package 300 may be one of multiple packages in an IC (not shown).

It should be appreciated that the layers 302a–c are not drawn to scale and that in general only relevant features of the layers 302a–c are shown for ease of illustration and explanation. The three dimensions of the package 300 are illustrated using x, y, and z axes. The values provided on the x and y axes in FIG. 3 do not correspond to particular units of measurement (such as millimeters or mils), but rather are generic units provided merely for ease of illustration and explanation. The x and y axes define what will be referred to herein as the "horizontal" dimensions of the package 300, while the z axis defines what will be referred to herein as the "vertical" dimension of the package 300. The x and y gridlines in each of the planes 302a–c are illustrated using dashed lines to clarify the coordinates of the signal traces in the layers 302a–c.

The distance H between each layer of the package 300 will be referred to herein as a "vertical" distance. Signal nets traverse vertical path lengths through vias, which are vertical conductors or conductive paths forming the interconnection between one layer of an IC and another. The distance H is typically on the order of 100 μm. The distances traversed by signal nets within a single layer will be referred to herein as "horizontal" distances.

Layer 302b includes a signal trace referred to herein by reference numeral 304 and including three segments 304a–c. Although the signal trace 304 may be one of many signal traces in a signal net that spans one or more layers of the package 300, the signal trace 304 is shown in isolation in FIG. 3 for ease of illustration and explanation. A typical package may include thousands of signal nets. The first segment 304a of signal trace 304 has (x, y) endpoints of (2, 7) and (2, 5). The second segment 304b of signal trace 304 has (x, y) endpoints of (2, 5) and (1, 4). The third segment 304c of signal trace 304 has (x, y) endpoints of (1, 4) and (1, 1).

Layer 302b also includes signal traces 306, 308, and 310 (which includes segments 310a and 310b). Although signal traces 306, 308, and 310 are illustrated solely within layer 302b in FIG. 3 for ease of illustration and explanation, these signal traces may be connected through signal vias to signal traces in other layers of the package 300.

Layer 302a includes signal trace 312 (which includes segments 312a and 312b), and layer 302c includes signal trace 314 (which includes segments 314a, 314b, and 314c). Although layers 302a and 302c are ground layers, ground layers may contain signal traces in addition to ground metal. In the description below, the various signal traces illustrated in FIG. 3 and their relative locations in the package model 300 will be used to illustrate the application of methods that are performed in various embodiments of the present invention.

Figure 4A:
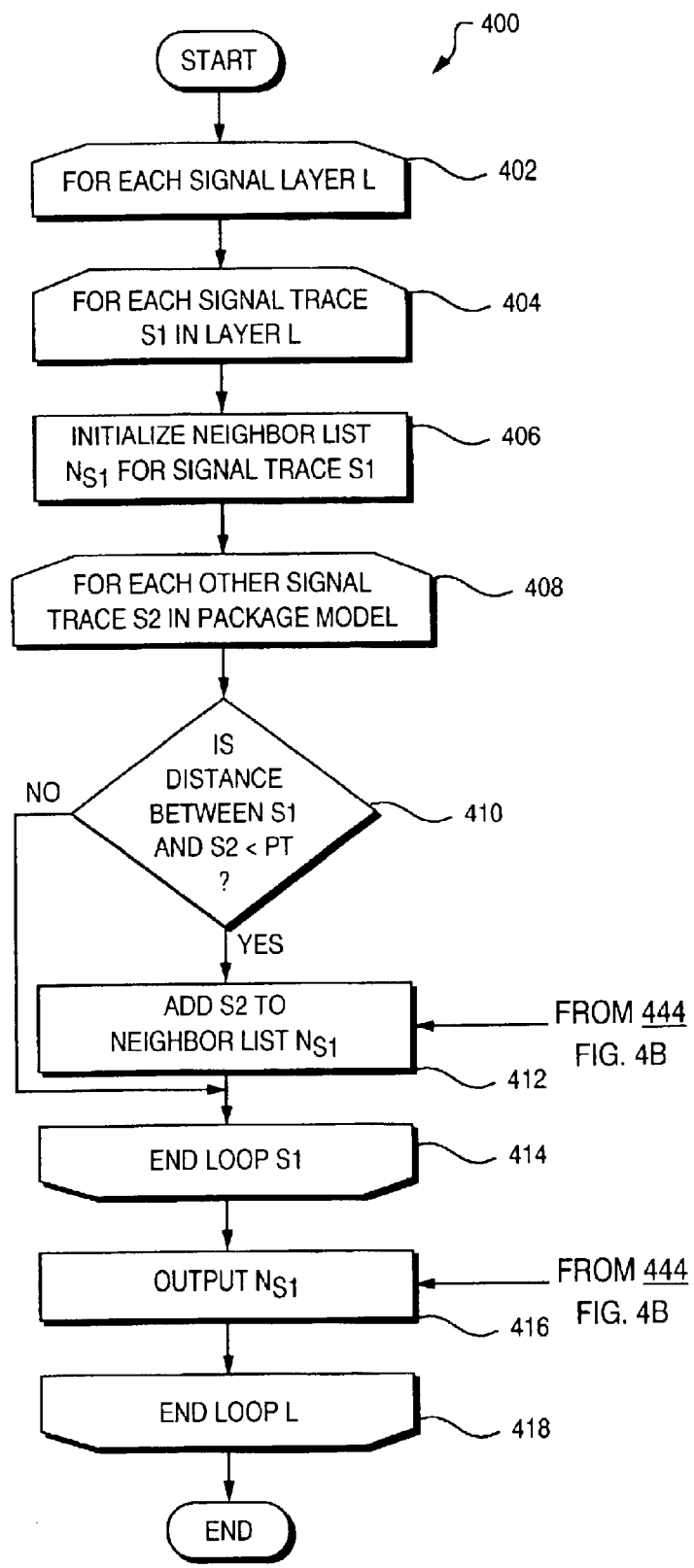
FIG. 4A is a flowchart of a method for detecting and informing a package designer about the neighbors of each signal trace in a package model according to one embodiment of the present invention.

Referring to FIG. 4A, a flowchart is shown of a neighbor detection method 400 that is used by the proximity verifier 202 to detect and inform the package designer 116 about the neighbors of each signal trace in the package model 201 according to one embodiment of the present invention.

Prior to initiation of the method 400, the package designer 116 may provide configuration information 210 to the proximity verifier 202. The configuration information 210 may, for example, take the form of a command line with parameters, a configuration file stored on a hard disk drive, or commands issued to the proximity verifier 202 using a graphical user interface. Provision of the configuration information 210 to the proximity verifier 202 by the package designer 116 may therefore serve both to initiate the neighbor detection method 400 and to provide parameter values to the proximity verifier 202 for use in the neighbor detection method 400.

Figure 5:
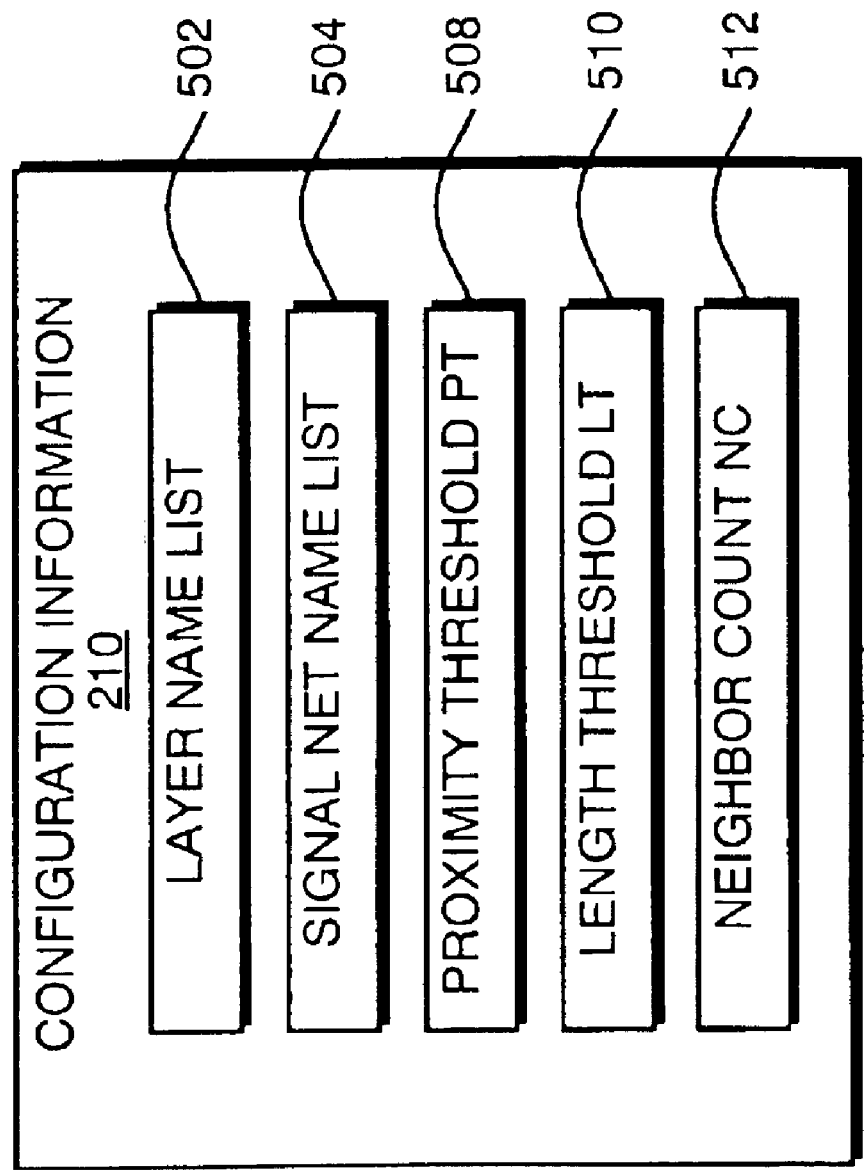
FIG. 5 is a block diagram of the logical structure of configuration information that is used to verify the proximity of ground metal to signal traces in an integrated circuit package according to one embodiment of the present invention.

Referring to FIG. 5, the logical structure of the configuration information 210 is illustrated according to one embodiment of the present invention. The configuration information 210 includes a proximity threshold 508, which specifies the minimum allowable distance between signal traces in the package model 201. The proximity threshold 508 (also referred to herein as PT) may therefore be used to enforce what are referred to herein as "inter-signal spacing requirements." Furthermore, two signal traces may be considered to be "neighbors" if the distance between them is less than the proximity threshold 508.

The proximity threshold 508 may, for example, specify a maximum allowable horizontal distance, i.e., a maximum allowable distance between the planar (x, y) coordinates of two signal traces. Alternatively, the proximity threshold 508 may specify a maximum allowable "straight-line" distance having both horizontal and vertical (inter-layer) components in three-dimensional space. The proximity threshold 508 may be any value, and may be specified in any units, such as millimeters, mils, or microns.

The configuration information 210 also includes a signal net name list 504, which is a list of the names of the signal nets to be processed by the neighbor detection method 400. A signal net may span multiple layers in a package; a signal trace may therefore be a subset of a signal net.

The configuration information 210 also includes a layer name list 502, which is a list of the names of package layers to be processed by the neighbor detection method 400. The signal net name list 504 and the layer name list 502 may specify the names of signal nets and layers, respectively, using the same names used within the package model 201 itself.

Although not shown in FIG. 5, the configuration information 210 may further specify regions (areas) of the package model 201 to which the method 400 is to be applied. It may, for example, be acceptable and/or unavoidable for signal traces to be closer to each other than the proximity threshold PT in certain regions of the package model 201, such as in regions closely surrounding signal vias. The package designer 116 may use the configuration information 210 to indicate that the method 400 is not to be applied to signal traces within such regions.

Referring again to FIG. 4A, the neighbor detection method 400 enters a loop over each signal layer L specified by the layer name list 502 (step 402). The method 400 enters a loop over each signal trace S1 specified by the signal net name list 504 (step 404). In other words, if S is a signal net specified by the signal net name list 504, S1 refers to that portion of signal net S that lies within layer L. Assume for purposes of example that the signal trace S1 is the signal trace 304 illustrated in FIG. 3.

The method 400 initializes a neighbor list $N_{S1}$ for signal trace S1 (step 406). As described in more detail below, the method 400 records the neighbors, if any, of signal trace S1 in the neighbor list $N_{S1}$ as they are identified. The neighbor list $N_{S1}$ is initially empty.

The method 400 enters a loop over each signal trace S2 in the package model 201 other than signal trace S1 (step 408). In this loop, the method 400 determines whether each signal trace S2 is a neighbor of signal trace S1 and adds signal trace S2 to the neighbor list $N_{S1}$ if signal trace S2 is determined to be a neighbor of signal trace S1. Signal trace S2 is determined to be a neighbor of signal trace S1 if the distance between signal trace S1 and signal trace S2 is less than the proximity threshold PT (step 410). The method 400 adds signal trace S2 to the neighbor list $N_{S1}$ if signal trace S2 is determined to be a neighbor of signal trace S1 (step 412). The method 400 may, for example, add the name or other identifier of signal trace S2 to the neighbor list $N_{S1}$. The method repeats steps 410 and 412 for the remaining signal traces S2 (step 414), thereby building the neighbor list $N_{S1}$ for signal trace S1.

After building the neighbor list $N_{S1}$, the method 400 outputs the neighbor list $N_{S1}$, e.g., by adding the neighbor list $N_{S1}$ to the proximity indicators 208 (step 416). If, for example, the proximity indicators 208 are stored in a file, the neighbor list $N_{S1}$ may be added to the file. It should be appreciated that upon performance of step 416 the neighbor list $N_{S1}$ contains a list of the neighbors, if any, of signal trace S1.

The loop over L terminates in step 418, thereby repeating steps 406–416 for each of the signal nets specified by the signal net name list 504 in each of the layers specified by the layer name list 502.

Upon completion of the method 400, the proximity indicators 208 include neighbor lists for all of the signal traces specified by the signal net name list 504 in each of the layers specified by the layer name list 502. Alternatively, the proximity indicators 208 may, for example, include neighbor lists for only those signal traces which have at least one neighbor. The proximity indicators 208 may, for example, be stored in a text file or be represented as design rule violation indicators 214 in the package model 201, as described in more detail below. The package designer 116 may examine the proximity indicators 208 to determine whether any signal traces should be re-routed to position them so that they are separated by at least the proximity threshold PT from all other signal traces.

Although the method 400 illustrated in FIG. 4 generates a neighbor list for each signal trace in each of the signal nets specified in the signal net name list 504, the method 400 may alternatively generate a neighbor list for each specified signal net as a whole. In such an embodiment, the neighbor list $N_{S1}$ would be replaced by a neighbor list $N_S$ which would identify the neighbors, if any, of signal net S. Those of ordinary skill in the art will appreciate how to modify the method 400 to generate neighbor lists for entire signal nets rather than for individual signal traces in signal nets.

Figure 4B:
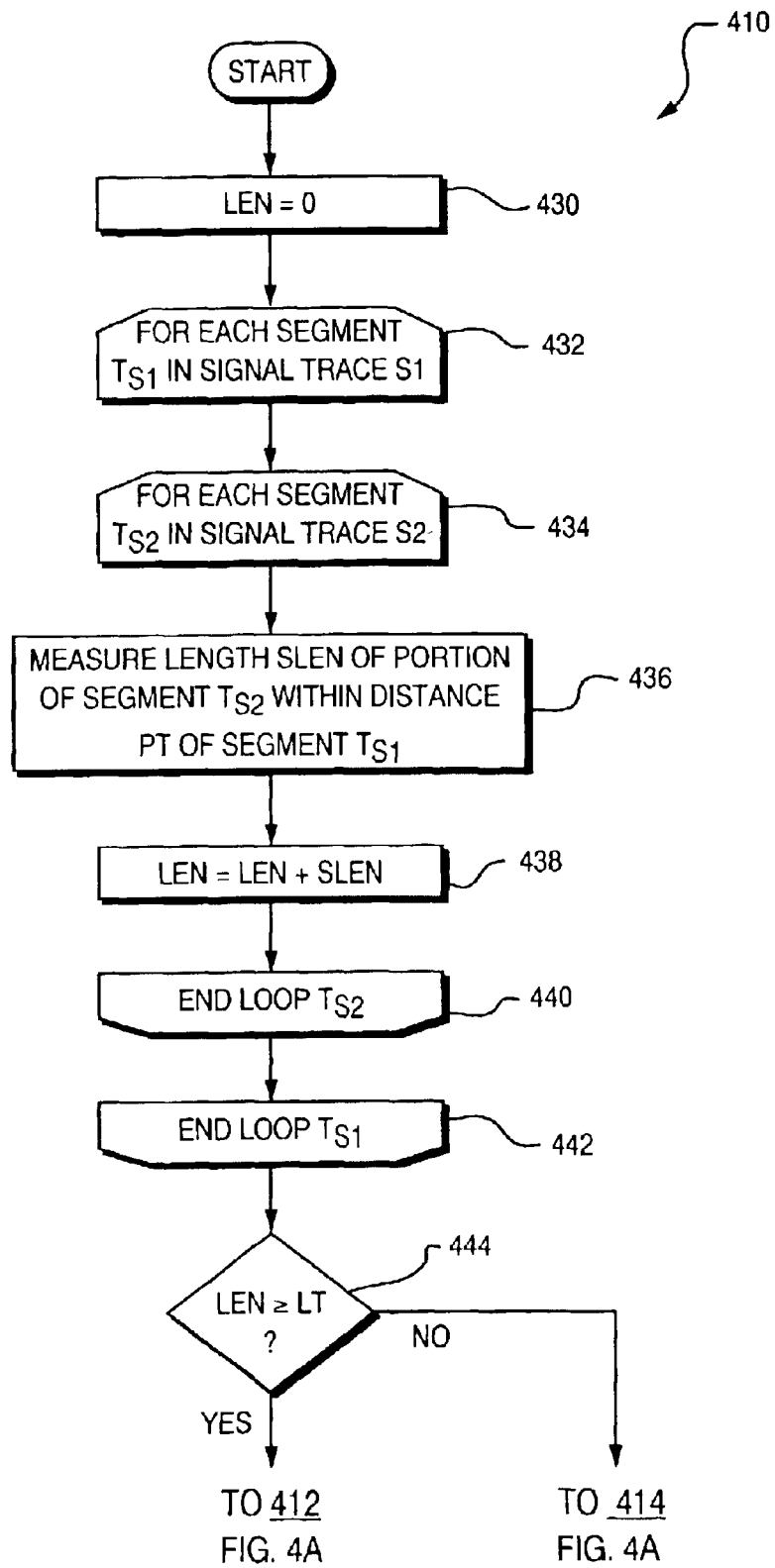
FIG. 4B is a flowchart of a method for determining whether the distance between two signal traces and is less than a proximity threshold according to one embodiment of the present invention.

Referring to FIG. 4B, a flowchart of a method is shown that may be used to determine whether the distance between signal traces S1 and S2 is less than the proximity threshold PT (FIG. 4A, step 410) according to one embodiment of the present invention. In the particular embodiment illustrated in FIG. 4B, the method 410 only considers signal trace S2 to be a neighbor of signal trace S1 if signal trace S2 is within the proximity threshold PT of signal trace S1 for at least a minimum length threshold LT along signal trace S1. The package designer 116 may, for example, specify the minimum length threshold LT in the configuration information 210 (as illustrated by length threshold 510 in FIG. 5).

The method 410 may alternatively, however, determine whether signal trace S2 is a neighbor of signal trace S1 in other ways. For example, the method 410 may alternatively consider any signal trace S2 to be a neighbor of signal trace S1 if any point on signal trace S2 is within the proximity threshold distance PT of any point on signal trace S1.

Returning to FIG. 4B, the method 410 measures the aggregate length of all portions (if any) of signal trace S1 that are within the proximity threshold of signal trace S2 and stores this aggregate length in a variable named LEN. The method 410 initializes the value of LEN to zero (step 430).

The method 410 begins by entering a loop over each segment $T_{S1}$ in signal trace S1 (step 432). For example, as described above with respect to FIG. 3, signal trace 304 includes three segments 304a–c. The method 410 enters a loop over each segment $T_{S2}$ in the signal trace S2 (step 434). The method 410 measures the length of that portion, if any, of segment $T_{S2}$ that is within distance PT of segment $T_{S1}$ and stores the measured length in a variable named SLEN (step 436). The method 410 adds the value of SLEN to the value of LEN and stores the resulting new aggregate length in LEN (step 438). The method 410 repeats step 436–438 for each remaining segment $T_{S2}$ of signal trace S2 (step 440), and repeats steps 434–440 for each remaining segment $T_{S1}$ of signal trace S1 (step 442). Upon completion of step 442, the value of the variable LEN represents the aggregate length of portions of signal trace S1 which are within distance PT of any portion of signal trace S2.

The method 410 determines whether the value of LEN is greater than or equal to the minimum length threshold LT (step 444). If LEN is greater than or equal to LT, then the method 410 considers signal trace S2 to be a neighbor of signal trace S1, and control passes to step 412 of method 400 (FIG. 4A), in which signal trace S2 is added to signal trace S1's neighbor list $N_{S1}$. Otherwise, the method 410 considers signal trace S2 not to be a neighbor of signal trace S1, and control passes to step 414 of method 400 (FIG. 4A) without adding signal trace S2 to signal trace S1's neighbor list $N_{S1}$.

Consider, for example, the signal traces illustrated in FIG. 3. Assume for purposes of example that the signal trace S1 is the signal trace 304, that the proximity threshold PT is one measurement unit, that the length threshold LT is two measurement units, and that the method illustrated in FIG. 4B is used to implement step 410 of the method 400 illustrated in FIG. 4A. It may be seen by reference to FIG. 3 that the signal trace 306 is separated from signal trace 304 by exactly one measurement unit (purely along the x axis in this case) for a length of two measurement units along signal trace 304 (from coordinates (2, 7) to coordinates (2, 5)). Signal trace 306 therefore satisfies the inter-signal spacing requirement in this example, which defines a neighbor as a signal trace that is within one measurement unit of the reference signal trace S1 (i.e., signal trace 304) for at least two measurement units. In this example, signal trace 306 would therefore qualify as a neighbor of signal trace 304 in step 410 of method 400 and be added to signal trace 304's neighbor list in step 412 of method 400 (FIG. 4A).

Turning now to signal trace 308, it may be seen by reference to FIG. 3 that signal trace 308 is at no point within one measurement unit of any part of signal trace 304. Signal trace 308 therefore is not a neighbor of signal trace 304 in this example and therefore would not be added to signal trace 304's neighbor list in step 412 of method 400.

Turning now to signal trace 310, it may be seen by reference to FIG. 3 that signal trace 310 is separated by exactly one measurement for a total length of one measurement unit along signal trace 304 (from coordinates (1, 2) to coordinates (1, 1)). Although some portion of signal trace 310 is within the proximity threshold of signal trace 304, the length of this portion does not satisfy the length threshold LT. Signal trace 310 would therefore not qualify as a neighbor of signal trace 304 and would not be added to signal trace 304's neighbor list in step 412.

Now consider signal trace 314 (which includes segments 314a, 314b, and 314c) in layer 302c. For purposes of example, segment 314 follows the same route in the x-y plane of layer 302c as segment 304 follows in the x-y plane of layer 302b. Whether signal trace 314 would qualify as a neighbor of signal trace 304 depends on the distance H between layers 302b and 302c. The signal trace 314 would, for example, qualify as a neighbor of signal trace 304 if the distance H were less than or equal to one measurement unit. If, for example, the distance H were exactly one measurement unit, the signal trace 314 would be within the proximity threshold PT for a total length of approximately 5.4 measurement units, thereby qualifying as a neighbor of signal trace 304.

Now consider signal trace 312 (which includes segments 312a and 312b). Whether signal trace 312 would qualify as a neighbor of signal trace 304 depends on the distance H between layers 302a and 302b. Because the segments of signal trace 312 are offset from the segments of signal trace 304 in all three of the x, y, and z axes, determining whether signal trace 312 qualifies as a neighbor of signal trace 304 would require measuring the distances between portions of signal traces 304 and 312 in three dimensions. Techniques for performing such computations based on the coordinates of signal traces 304 and 312 will be apparent to those of ordinary skill in the art based on the description herein.

Figure 4C:
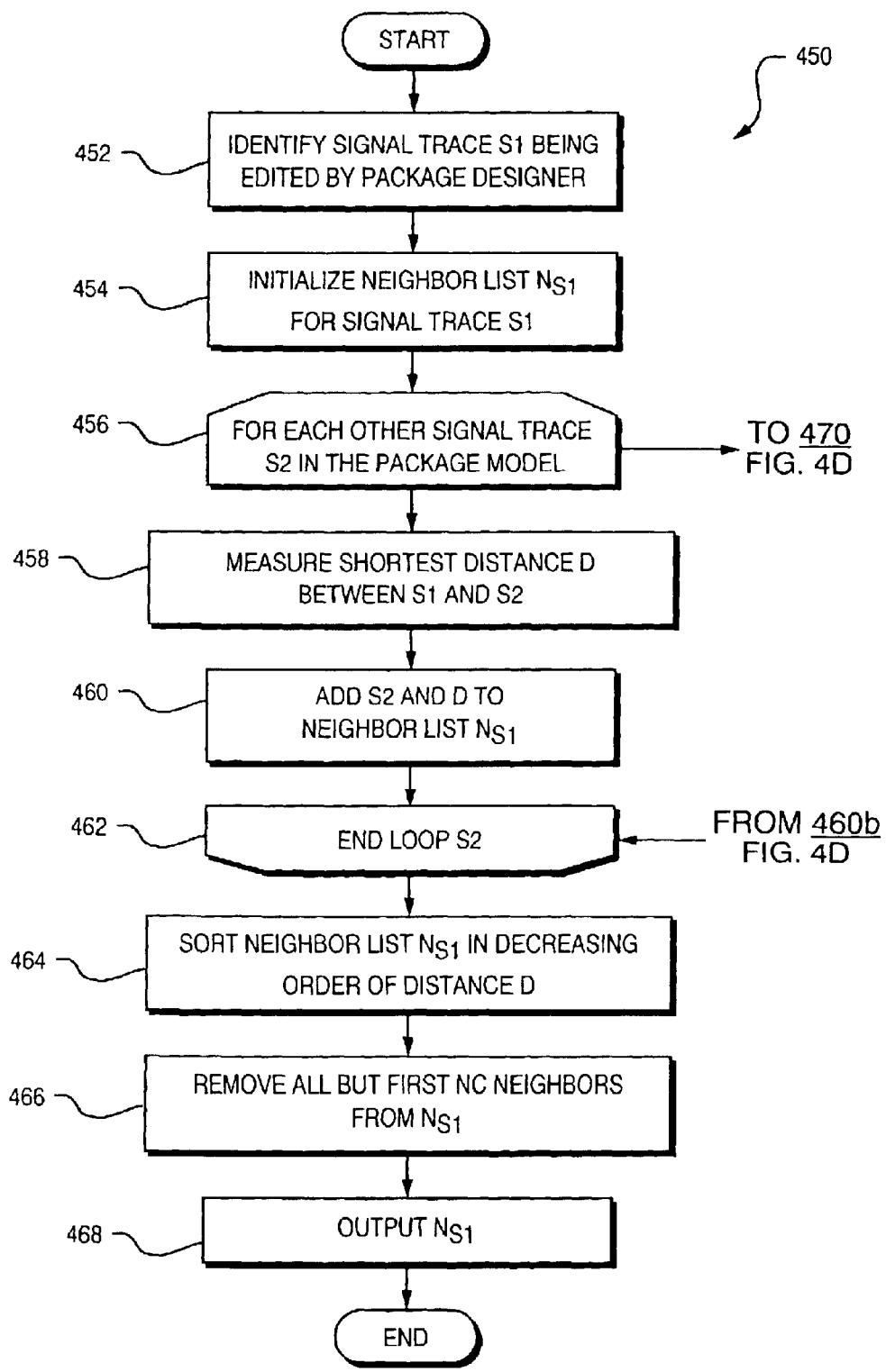
FIG. 4C is a flowchart of a method for informing a package designer of any portions of a signal trace which are within less than a threshold distance of other signal traces in a package model according to one embodiment of the present invention.

Referring to FIG. 4C, a flowchart is shown of a proximity verification method 400 that is used by the proximity verifier 202 to inform the package designer 116 about any portions of the signal trace currently being edited which are within less than the proximity threshold PT of other signal traces in the package model 201 according to one embodiment of the present invention.

The method 450 may, for example, be executed in real-time, i.e., while the package designer 116 is using the package design tool 104 to edit a particular signal trace S1 in the package model 201. Techniques for implementing the method 450 in real-time will be described in more detail below. The method 450 identifies the signal trace S1 currently being edited by the package designer 116 (step 452). The method 450 initializes a temporary neighbor list $N_{S1}$ for signal trace S1 (step 454). As described in more detail below, the method 450 adds the neighbors, if any, of signal trace S1 to the temporary neighbor list $N_{S1}$ and informs the package designer 116 of the neighbors in the list $N_{S1}$ which are closest to signal trace S1.

For example, in one embodiment the method 450 identifies the neighbors of signal trace S1 as follows. The method 450 enters a loop over each signal trace S2 other than signal trace S1 in the package model 201 (step 456). The method 450 measures the shortest distance D between signal trace S1 and signal trace S2 (step 458). Examples of techniques that may be used to measure the distance D will be described below with respect to FIG. 4D. The method 450 adds to the neighbor list $N_{S1}$ a list element which identifies both the signal trace S2 and the distance D between signal traces S1 and S2 (step 460a). The signal trace S2 may, for example, be identified by its name or other identifier. The method 450 repeats steps 458–460a for the remaining signal traces S2 (step 462). Upon completion of step 462, the neighbor list $N_{S1}$ identifies the shortest distances between each of the signal traces S2 and the signal trace S1 currently being edited by the package designer 116.

The method 450 sorts the neighbor list $N_{S1}$ in decreasing order of distance D (step 464). Upon completion of step 464, the first element in the neighbor list $N_{S1}$ identifies the closest signal trace to signal trace S1, the second element identifies the next-closest signal trace, and so on. The method 450 removes all but the first NC elements from the neighbor list $N_{S1}$ (step 466). The value NC, also referred to herein as a "neighbor count," may be provided by the package designer in the configuration information (as indicated by reference numeral 512 in FIG. 5). Upon completion of step 466, the neighbor list $N_{S1}$ identifies only the NC closest signal traces to signal trace S1.

The method 450 outputs the neighbor list $N_{S1}$, e.g., by adding the neighbor list $N_{S1}$ to the proximity indicators 208 (step 468). The method 450 may, for example, provide visual indications in the graphical package representation 106 of the points on signal trace S1 which are closest to the neighbors in the neighbor list $N_{S1}$. Such visual indications may, for example, be circles or red flags on or near the points on signal trace S1 which are closest to the neighbors in the neighbor list $N_{S1}$. For example, referring again to FIG. 3, visual indicators 316a and 316b indicate that the indicated portions of the signal trace 304 are too close to other signal traces (in this case, signal traces 306 and 310, respectively). Alternatively, if the proximity indicators 208 are stored in a file, the neighbor list $N_{S1}$ may be added to the file.

Figure 4D:
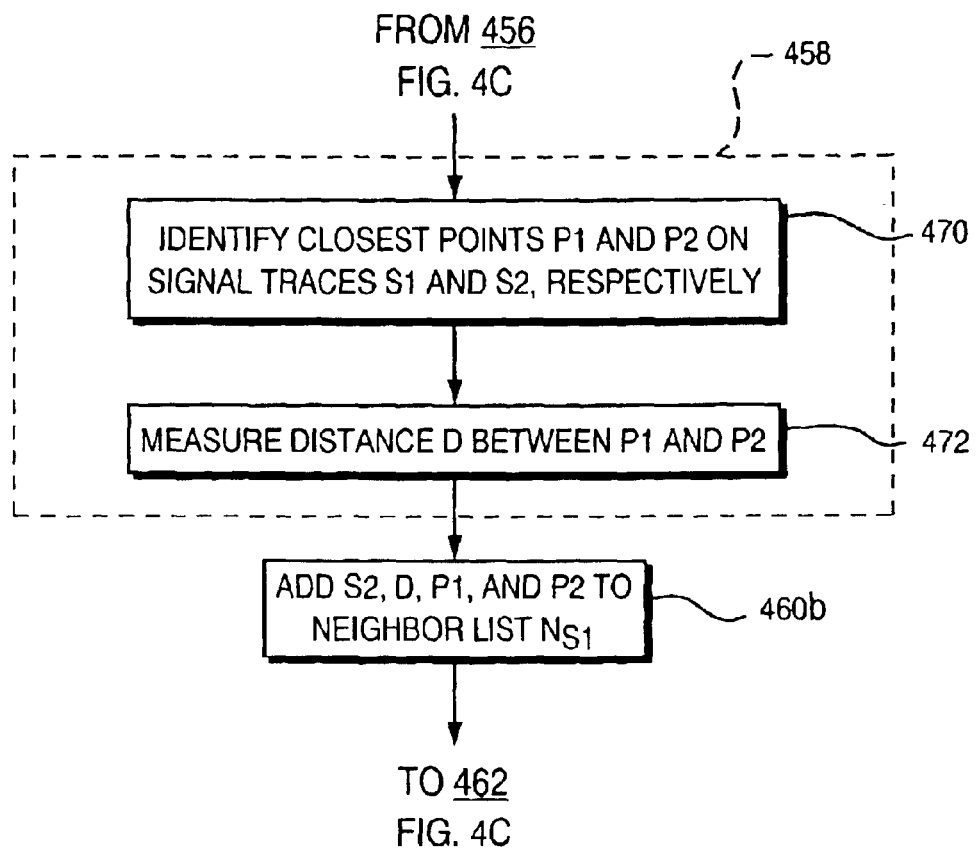
FIG. 4D is a flowchart of a method for measuring the shortest distance between two signal traces according to one embodiment of the present invention.

As described above with respect to FIG. 4C, the method 450 may measure the shortest distance D between signal traces S1 and 52 (step 458). Referring to FIG. 4D, one example is shown of techniques that the method 450 may use to perform this measurement. The method 450 identifies the points P1 and P2 on signal traces S1 and S2 that are closest to each other (step 470). In other words, points P1 and P2 are at least as close to each other as any other two points on signal traces S1 and S2, respectively. If there are multiple pairs of closest points on signal traces S1 and S2 (e.g., if the closest portions of signal traces S1 and S2 are parallel line segments), the method 450 may select any such pair of points as the points P1 and P2.

The method 450 measures the distance D by measuring the distance between points P1 and P2 (step 472). The method 450 may then add to the neighbor list $N_{S1}$ a list element identifying the signal trace S2, the corresponding distance D, and the points P1 and P2 (step 460b). Note that in this embodiment, step 460b replaces and performs a function similar to that of step 460a (FIG. 4C).

Figure 4E:
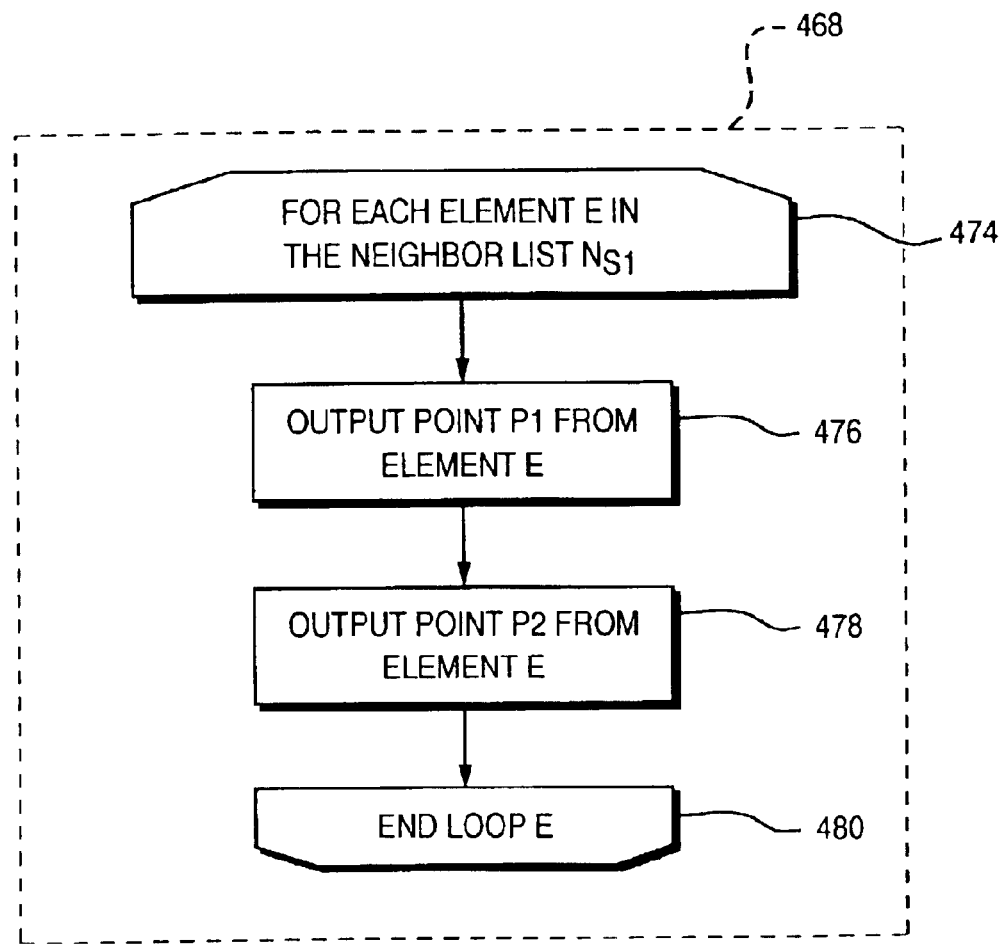
FIG. 4E is a flowchart of a method for outputting a list of signal traces that neighbor a reference signal trace according to one embodiment of the present invention.

Referring to FIG. 4E, a flowchart is shown of an embodiment of step 468 (outputting the neighbor list $N_{S1}$) when the distance D is measured using the techniques illustrated in FIG. 4D. In the embodiment illustrated in FIG. 4E, step 468 enters a loop over each element E in the neighbor list $N_{S1}$ (step 474) and outputs the points P1 (step 476) and P2 (step 478) associated with the element E. Steps 476 and 478 are repeated for each element E (step 480). In this way step 468 outputs the points on signal trace S1 and signal trace S2 that are closest to each other. Alternatively, step 468 may output only the point P1 or the point P2 for each element in the neighbor list $N_{S1}$.

As described above with respect to FIG. 4C, the method 450 may output points P1 and P2 in any of a variety of ways, such as by writing their coordinates to a file or by providing visual indications of their coordinates in the graphical package representation 106. Various other aspects of the method 450 may also be implemented in other ways. For example, the method 450 may identify the NC closest points on a per-segment or per-net rather than a per-trace basis.

The methods described above with respect to FIGS. 4A–4E make use of various data from the package model 201, such as the names and coordinates of signal traces. Various techniques that may be used by the proximity verifier 202 to access and process such data will now be described in more detail.

As described above with respect to FIG. 2, the proximity verifier 202 may access information in the package model 201 by transmitting package model access commands 204 to the package design tool 104. The package model access commands 204 may take any of a variety of forms. For example, the package design tool 104 may provide an application program interface (API) through which external software programs may access information contained in the package model 201 using commands defined according to the API. The proximity verifier 202 may be implemented as such a software program, and the package model access commands 204 may be implemented as commands defined according to the package design tool's API. The API may include both commands for reading information from the package model 201 and commands for writing information to the package model 201. In such an implementation, the proximity verifier 202 transmits package model access commands 204 to the package design tool 104, in response to which the package design tool 104 either modifies information in the package model 201 or transmits the requested information about the package model to the proximity verifier 202 in the form of package model information 206.

The package model information 206 may, for example, be a report, such as one of the conventional package property reports 110 described above with respect to FIG. 1. Such a report may be a text file including information such as the names, locations, and sizes (e.g., lengths or diameters) of signal traces, ground metal, vias, and other elements of the package model. The proximity verifier 202 may process the information in such a report to perform the functions described herein using techniques that are well-known to those of ordinary skill in the art.

The proximity verifier 202 may be implemented as a software program that executes within the design environment provided by the package design tool 104. For example, the APD package design tool described above provides a scripting language named "Skill." Scripts written in the Skill language may be executed within the APD design environment, e.g., while the package designer 116 is using the package design tool 104 to design the package model 201. The proximity verifier 202 may be implemented as a Skill script, in which case the package model access commands 204 may be Skill commands issued by the proximity verifier 202 to the package design tool 104. Alternatively, the proximity verifier 202 may, for example, be implemented as a Perl script for use with other package design tools.

Referring again to FIG. 2, the package model 201 may include design rules 212 which specify constraints that elements within the package model 201 must satisfy to ensure successful fabrication and operation of the package being modeled. Such constraints may include, for example, electrical, geometrical, or timing constraints. A design rule may, for example, specify a minimum distance between signal traces in a layer, or specify a maximum signal trace density in a layer. Conventional package design tools, such as APD, typically provide default design rules and means for specifying additional design rules to be applied to a package model. Conventional package design tools also typically include automated Design Rule Checkers (DRCs), which automatically determine whether the active design rules are satisfied, and which use design rule violation indicators 214 to alert the package designer 116 to any design rules which are violated by the package model 201. The design rule violation indicators 214 may, for example, be visual indicators (such as a red flag) displayed at the location of the violation within the graphical package representation 106 that is displayed to the package designer 116.

Rather than providing the package designer 116 with external proximity indicators 208 to indicate the presence and/or locations of signal trace neighbors in the package model 201, the proximity verifier 202 may use package model access commands 204 to insert design rule violation indicators 214 into the package model 201 when the proximity verifier 202 determines that signal traces do not satisfy inter-signal spacing requirements. For example, the proximity verifier 202 may output the neighbor list $N_{S1}$ (FIG. 4A, step 416; FIG. 4C, step 468) by adding one or more design rule violation indicators indicating the presence and/or location of any signal traces or portions thereof which do not satisfy the inter-signal spacing requirements. The design rule violation indicator thus provided may indicate the layer, signal trace, and coordinates at which the design rule violation was identified. Techniques for adding design rule violation indicators to package models maintained by conventional package design tools are well-known to those of ordinary skill in the art.

In one embodiment, the requirement that signal traces in the package model 201 be separated from each other by at least the proximity threshold PT is implemented using a design rule (referred to herein as the "proximity rule") within the design rules 212. In such an embodiment, it may not be necessary for the proximity verifier 202 to be implemented as a distinct external component, since the package design tool 104 may automatically apply the proximity rule. For example, the method 450 (FIG. 4C) may be implemented as a design rule. Furthermore, the method 400 illustrated in FIG. 400 may be modified to be implemented as a design rule by identifying neighbors only of the signal trace currently being edited rather than neighbors of all signal traces specified in the signal net name list 504. Such a modification could be made by removing steps 402, 404, 414, and 418, and by performing the resulting method on the single signal trace currently being edited. Such a method may, for example, highlight on the display monitor 112 the neighbors, if any, of the signal trace currently being edited.

Some package design tools, such as APD, provide "real-time" design rule checking, according to which the design rule violation indicators 214 are provided (e.g., displayed) to the package designer 116 as the package designer 116 designs the package model 201. For example, the package designer 116 may place a new signal trace within a layer of the package model 201 by using a mouse to drag a graphical representation of the signal trace to an appropriate location within the layer. The package design tool 104 may visually indicate to the package designer 116 in real-time whether the new signal trace is too close to existing signal traces, such as by displaying a red flag on the monitor 112 when the designer 116 drags the new signal trace too close to an existing signal trace.

The proximity rule may, for example, be implemented as a real-time design rule. In such an implementation, the package design tool 104 may verify in real-time that the proximity rule is satisfied for the signal trace being edited by the package designer 116, and provide appropriate design rule violation indicators 214 when the proximity rule is violated.

The proximity verifier 202 may measure the minimum distance between signal traces (FIG. 4A, step 410) and identify the closest points on two signal traces (FIG. 4D, step 470) in any of a variety of ways. For example, the proximity verifier 202 may measure the minimum distance between two signal traces as the minimum distance between the centers of the signal traces, the minimum distance between the outer edges of the signal traces, or the minimum distance between the center of one signal trace and the outer edge of the other signal trace. Various techniques that may be used to identify coordinates of signal traces and to measure distances between such coordinates are described in more detail in the above-referenced patent application entitled "Verifying Proximity of Ground Metal to Signal Traces in an Integrated Circuit."

Among the advantages of the invention are one or more of the following.

One advantage of various embodiments of the present invention is that they automate verification of inter-signal spacing requirements in an integrated circuit design, a process which conventionally is performed manually. Automated proximity verification enables such verification to be performed more quickly and reliably than manual verification.

Furthermore, the proximity indicators 208 provided by the proximity verifier 202 may be visual indicators included in the graphical representation 106 of the package model 201. Such visual indicators may point out the precise location of any portions of signal traces which do not satisfy the inter-signal spacing requirements, thereby making it easier for the package designer 116 to locate and re-route such signal traces. In particular, in embodiments of the present invention in which the function performed by the proximity verifier 202 is implemented in a real-time design rule, the proximity verifier may provide visual indications to the package designer 116 of the precise locations at which the signal trace currently being edited is too close to other signal traces, thereby potentially preventing problematic signal trace placements from occurring. Furthermore, the techniques disclosed herein may be implemented in conjunction with real-time design rule checking to dynamically provide the package designer 116 with feedback as he places and routes signal traces. The package designer 116 may therefore ensure that the signal trace being edited satisfies all minimum inter-signal spacing requirements by re-routing the signal trace until no design rule violations are indicated. Such techniques may be employed to enable package design to occur more rapidly and accurately than a system in which proximity verification is only performed after the package design is created.

Further, conventional systems which are capable of automatically detecting signal traces which are too close to each other typically signal errors at every location where signal traces are too close to each other. Such systems may signal a large number of errors if many points on many different signal traces are too close to each other. The circuit designer who is confronted with such a large number of errors may find it difficult to determine which errors are the most significant and indicate regions of the circuit design requiring the most attention. In contrast, certain embodiments of the present invention notify the circuit designer only of those points on signal traces which are closest to other signal traces, thereby effectively notifying the circuit designer of the areas in the circuit design which require the most attention. By filtering out less important errors and notifying the circuit designer only of those points on signal traces which are particularly close to each other, embodiments of the present invention may enable the circuit designer to focus his efforts on fixing particularly problematic regions of the circuit design.

Furthermore, conventional systems which are capable of automatically detecting signal traces which are too close to each other typically signal an error whenever points on two signal traces fail to satisfy the minimum inter-signal spacing requirement, even if the spacing requirement is only violated along a short length of the signal traces. In contrast, as described above with respect to FIG. 4B, in particular embodiments of the present invention, two signal traces are only identified as neighbors if they are within the proximity threshold PT for at least a threshold length LT. As a result, the circuit designer is not notified of signal traces which only violate the minimum inter-signal spacing requirement for an insignificant distance and which therefore do not require attention. The techniques disclosed herein therefore notify the circuit designer of only those signal traces which are most likely to require modification, thereby saving time and effort in the design process.

A further advantage of various embodiments of the present invention is that they provide cross-layer design rule checking. Although existing package design tools include built-in design rules, such rules typically define constraints, such as minimum inter-signal distance, that are only applied within a single package layer. Such design rules do not, however, define constraints, such as minimum inter-signal spacing, that are applied across multiple package layers. Similarly, automated crosstalk analysis tools typically analyze crosstalk within a single package layer. Various embodiments of the present invention provide means for verifying that cross-layer constraints, such as minimum inter-signal spacing, are satisfied, thereby relieving the package designer 116 of the responsibility for performing such verification manually.

Another advantage of the techniques disclosed herein is that they may be used to reduce the amount of coupling between signals in an integrated circuit design. It is undesirable, for example, for signals to be closely-spaced because of the cross-coupling noise that such an arrangement introduces in the signals. The techniques disclosed herein may be used to enforce the requirement that each signal trace be sufficiently distant from other signal traces in the package model 201 and thereby to reduce cross-coupling noise.

It is to be understood that although the invention has been described above in terms of particular embodiments, the foregoing embodiments are provided as illustrative only, and do not limit or define the scope of the invention. Various other embodiments, including but not limited to the following; are also within the scope of the claims.

Although the drawings and description herein may refer to data structures (e.g., the configuration information 210 and the proximity indicators 208) as having particular logical structures, these are provided merely for purposes of example and do not constitute limitations of the present invention. Rather, alternative data structures for representing equivalent information and for performing equivalent functions will be apparent to those of ordinary skill in the art. Furthermore, although various data structures are described as being implementable as text files, this is not a limitation of the present invention. Rather, such data structures may be implemented as binary files, database files, or using any appropriate computer-readable format.

Furthermore, although the proximity verifier 202 and the configuration information 210 are illustrated in FIG. 2 as distinct entities, it should be appreciated that they may be combined or further subdivided. For example, the proximity verifier 202 may be hard-coded with information contained in the configuration information 210.

Elements and components described herein may be further divided into additional components or joined together to form fewer components for performing the same functions.

The techniques described above may be implemented, for example, in hardware, software, firmware, or any combination thereof. The proximity verifier 202 may, for example, be implemented as a computer program. The techniques described above may be implemented in one or more computer programs executing on a programmable computer including a processor, a storage medium readable by the processor (including, for example, volatile and non-volatile memory and/or storage elements), at least one input device, and at least one output device. Program code may be applied to input entered using the input device to perform the functions described and to generate output. The output may be provided to one or more output devices.

Each computer program within the scope of the claims below may be implemented in any programming language, such as assembly language, machine language, a high-level procedural programming language, or an object-oriented programming language. The programming language may, for example, be a compiled or interpreted programming language.

Each such computer program may be implemented in a computer program product tangibly embodied in a machine-readable storage device for execution by a computer processor. Method steps of the invention may be performed by a computer processor executing a program tangibly embodied on a computer-readable medium to perform functions of the invention by operating on input and generating output. Suitable processors include, by way of example, both general and special purpose microprocessors. Generally, the processor receives instructions and data from a read-only memory and/or a random access memory. Storage devices suitable for tangibly embodying computer program instructions include, for example, all forms of non-volatile memory, such as semiconductor memory devices, including EPROM, EEPROM, and flash memory devices; magnetic disks such as internal hard disks and removable disks; magneto-optical disks; and CD-ROMs. Any of the foregoing may be supplemented by, or incorporated in, specially-designed ASICs (application-specific integrated circuits). A computer can generally also receive programs and data from a storage medium such as an internal disk (not shown) or a removable disk. These elements will also be found in a conventional desktop or workstation computer as well as other computers suitable for executing computer programs implementing the methods described herein, which may be used in conjunction with any digital print engine or marking engine, display monitor, or other raster output device capable of producing color or gray scale pixels on paper, film, display screen, or other output medium.

What is claimed is:

1. A computer-implemented method comprising steps of:
   (A) identifying a first signal net in a first layer of an integrated circuit design;
   (B) identifying a second signal net in a second layer of the integrated circuit design;
   (C) determining whether at least one portion of the second signal net is within a threshold distance of the first signal net;
   (D) if it is determined that at least one portion of the second signal net is within the threshold distance of the first signal net, measuring the aggregate length along the first signal net that is within the threshold distance of the second signal net;
   (E) determining whether the measured length is at least as great as a threshold length; and
   (F) notifying a user that the second signal net is a neighbor of the first signal net if it is determined that the measured length is at least as great as the threshold length.

2. The method of claim 1, wherein the step (A) comprises a step of:
   (A) (1) identifying a first signal net being edited by the user using an integrated circuit design tool; and
   wherein the step (F) comprises a step of:
   (F) (1) notifying the user that the second signal net is within the threshold distance of the first signal net while the user is editing the first signal net.

3. The method of claim 2, wherein the step (F) (1) comprises a step of providing to the user a visual indication of the second signal net.

4. The method of claim 3, wherein the step (F) (1) comprises a step of providing to the user a visual indication of coordinates on the first signal net, which are within the threshold distance of the second signal net.

5. The method of claim 1, wherein the first signal net comprises a first plurality of signal nets, and wherein the steps (A)–(F) are performed for each of the first plurality of signal nets.

6. The method of claim 1, wherein the step (B) comprises a step of identifying the second signal net from among a plurality of second signal nets, and wherein the steps (C)–(F) are repeated for each of the plurality of second signal nets.

7. The method of claim 1, wherein the step (F) comprises a step of generating a report identifying the first signal net and the second signal net.

8. The method of claim 7, wherein the first signal net comprises a first plurality of signal nets, and wherein the steps (A)–(F) are performed for each of the first plurality of signal nets.

9. The method of claim 1, wherein the integrated circuit design comprises a computer-implemented model of an integrated circuit tangibly stored in a computer-readable medium.

10. The method of claim 1, wherein the step (C) comprises steps of:
    (C)(1) measuring a distance between the at least one portion of the second signal net and the first signal net, wherein the distance includes both a non-zero horizontal component and a non-zero vertical component; and
    (C)(2) determining whether the measured distance is less than the threshold distance.

11. A computer-implemented system comprising:
    first identification means for identifying a first signal net in a first layer of an integrated circuit design;
    second identification means for identifying a second signal net in a second layer of the integrated circuit design;
    first determination means for determining whether at least one portion of the second signal net is within a threshold distance of the first signal net;
    measurement means for measuring the aggregate length along the first signal net that is within the threshold distance of the second signal net if it is determined that at least one portion of the second signal net is within the threshold distance of the first signal net;
    second determination means for determining whether the measured length is at least as great as a threshold length; and
    notification means for notifying a user that the second signal net is a neighbor of the first signal net if it is determined that the measured length is at least as great as the threshold length.

12. The system of claim 11, wherein the first identification means comprises means for identifying a first signal net being edited by the user using an integrated circuit design tool; and wherein the notification means comprises means for notifying the user that the at least one second signal net is within the threshold distance of the first signal net while the user is editing the first signal net.

13. The system of claim 12, wherein the notification means comprises means for providing to the user a visual indication of the second signal net.

14. The system of claim 13, wherein the notification means comprises means for providing to the user a visual indication of coordinates on the first signal net, which are within the threshold distance of the second signal net.

15. The system of claim 11, wherein the first signal net comprises a first plurality of signal nets, and wherein the system further comprises means for applying the first identification means, the second identification means, the first determination means, the measurement means, the second determination means, and the notification means to each of the first plurality of signal nets.

16. The system of claim 11, wherein the second identification means comprises means for identifying the second signal net from among a plurality of second signal nets, and wherein the system further comprises means for applying the first determination means, the measurement means, the second determination means, and the notification means to each of the plurality of second signal nets.

17. The system of claim 11, wherein the notification means comprises means for generating a report identifying the first signal net and the second signal net.

18. The system of claim 17, wherein the first signal net comprises a first plurality of signal nets, and wherein the system further comprises means for applying the first identification means, the second identification means, the first determination means, the measurement means, the second determination means, and the notification means to each of the first plurality of signal nets.

19. The system of claim 11, wherein the integrated circuit design comprises a computer-implemented model of an integrated circuit tangibly stored in a computer-readable medium.

20. The system of claim 11, wherein the first determination means comprises:
    means for measuring a distance between the at least one portion of the second signal net and the first signal net, wherein the distance includes both a non-zero horizontal component and a non-zero vertical component; and
    means for determining whether the measured distance is less than the threshold distance.

21. A computer-readable medium tangibly embodying computer program instructions for performing steps of:
- (A) identifying a first signal net in a first layer of an integrated circuit design;
- (B) identifying a second signal net in a second layer of the integrated circuit design;
- (C) determining whether at least one portion of the second signal net is within a threshold distance of the first signal net;
- (D) if it is determined that at least one portion of the second signal net is within, the threshold distance of the first signal net, measuring the aggregate length along the first signal net that is within the threshold distance of the second signal net;
- (E) determining whether the measured length is at least as great as a threshold length; and
- (F) notifying a user that the second signal net is a neighbor of the first signal net if it is determined that the measured length is at least as great as the threshold length.

22. The computer-readable medium of claim 21, wherein the computer program instructions for performing the step (A) comprise instructions for performing a step of:
- (A) (1) identifying a first signal net being edited by the user using an integrated circuit design tool; and
- wherein the computer program instructions for performing the step (F) comprise instructions for performing a step of:
  - (F) (1) notifying the user that the second signal net is within the threshold distance of the first signal net while the user is editing the first signal net.

23. The computer-readable medium of claim 22, wherein the computer program instructions for performing the step (F) (1) comprise instructions for performing a step of providing to the user a visual indication of the second signal net.

24. The computer-readable medium of claim 23, wherein the computer program instructions for performing the step (F) (1) comprise instructions for performing a step of providing to the user a visual indication of coordinates on the first signal net, which are within the threshold distance of the second signal net.

25. The computer-readable medium of claim 21, wherein the first signal net comprises a first plurality of signal nets, and wherein the computer program instructions comprise instructions for performing the steps (A)–(F) for each of the first plurality of signal nets.

26. The computer-readable medium of claim 21, wherein the computer program instructions for performing the step (B) comprise instructions for performing a step of identifying the second signal net from among a plurality of second signal nets, and wherein the computer program instructions comprise instructions for repeating the steps (C)–(F) for each of the plurality of second signal nets.

27. The computer-readable medium of claim 21, wherein the computer program instructions for performing the step (F) comprise instructions for performing a step of generating a report identifying the first signal net and the second signal net.

28. The computer-readable medium of claim 27, wherein the first signal net comprises a first plurality of signal nets, and wherein the computer program instructions comprise instructions for performing the steps (A)–(F) for each of the first plurality of signal nets.

29. The computer-readable medium of claim 21, wherein the integrated circuit design comprises a computer-implemented model of an integrated circuit tangibly stored in a computer-readable medium.

30. The computer-readable medium of claim 21, wherein the computer program instructions for performing the step (C) comprise instructions for performing steps of:
- (C) (1) measuring a distance between the at least one portion of the second signal net and the first signal net, wherein the distance includes both a non-zero horizontal component and a non-zero vertical component; and
- (C) (2) determining whether the measured distance is less than the threshold distance.

31. A computer-implemented method comprising steps of:
- (A) identifying a first signal net in an integrated circuit design;
- (B) identifying a plurality of second signal nets in the integrated circuit design;
- (C) identifying a subset of the plurality of second signal nets that are closest to the first signal net by performing steps of:
  - (C) (1) sorting the plurality of second signal nets according to distances between the first signal net and the plurality of second signal nets to produce a sorted signal net list;
  - (C)(2) identifying a number NC; and
  - (C)(3) identifying the first NC signal nets in the sorted signal net list as the subset of the plurality of second signal nets; and
- (D) notifying a user of the subset of the plurality of second signal nets.

32. The method of claim 31, wherein the step (A) comprises a step of:
- (A) (1) identifying a first signal net being edited by the user using an integrated circuit design tool; and
- wherein the step CD) comprises a step of:
  - (D) (1) notifying the user of the plurality of second signal nets while the user is editing the first signal net.

33. The method of claim 32, wherein the step (D) (1) comprises a step of providing to the user a visual indication of the at least one second signal net.

34. The method of claim 33, wherein the step CD) (1) comprises a step of providing to the user a visual indication of coordinates on the first signal net, which are closest to the subset of the plurality of second signal nets.

35. The method of claim 31, wherein the first signal net comprises a first plurality of signal nets, and wherein the method further comprises a step of performing the steps (A), (B), (C), and (D) for each of the first plurality of signal nets.

36. The method of claim 31, wherein the step (D) comprises a step of generating a report identifying the first signal net and the subset of the plurality of second signal nets.

37. The method of claim 36, wherein the first signal net comprises a first plurality of signal nets, and wherein the method further comprises a step of performing the steps (A), (B), (C), and (D) for each of the first plurality of signal nets.

38. The method of claim 31, wherein the integrated circuit design comprises a computer-implemented model of an integrated circuit tangibly stored in a computer-readable medium.

39. The method of claim 31, wherein the step (A) comprises a step of identifying the first signal net in a first layer of the integrated circuit design, and wherein the subset identified in the step (C) includes at least one signal net in a second layer of the integrated circuit design.

40. A computer-implemented system comprising:
- first identification means for identifying a first signal net in an integrated circuit design;

second identification means for identifying a plurality of second signal nets in the integrated circuit design;

subset identification means for identifying a subset of the plurality of second signal nets that are closest to the first signal net, the subset identification means comprising:

means for sorting the plurality of second signal nets according to distances between the first signal net and the plurality of second signal nets to produce a sorted signal net list;

means for identifying a number NC; and means for identifying the first NC signal nets in the sorted signal net list as the subset of the plurality of second signal nets; and notification means for notifying a user of the subset of the plurality of second signal nets.

41. The system of claim 40, wherein the first identification means comprises:

means for identifying a first signal net being edited by the user using an integrated circuit design tool; and wherein the notification means comprises:

means for notifying the user of the plurality of second signal nets while the user is editing the first signal net.

42. The system of claim 41, wherein the notification means comprises means for providing to the user a visual indication of the at least one second signal net.

43. The system of claim 42, wherein the notification means comprises means for providing to the user a visual indication of coordinates on the first signal net, which are closest to the subset of the plurality of second signal nets.

44. The system of claim 40, wherein the first signal net comprises a first plurality of signal nets, and wherein the system further comprises means for applying the first identification means, the second identification means, the subset identification means, and the notification means to each of the first plurality of signal nets.

45. The system of claim 40, wherein the notification means comprises a step of generating a report identifying the first signal net and the subset of the plurality of second signal nets.

46. The system of claim 45, wherein the first signal net comprises a first plurality of signal nets, and wherein the system further comprises means for applying the first identification means, the second identification means, the subset identification means, and the notification means to each of the first plurality of signal nets.

47. The system of claim 40, wherein the integrated circuit design comprises a computer-implemented model of an integrated circuit tangibly stored in a computer-readable medium.

48. The system of claim 40, wherein the first identification means comprises means for identifying the first signal net in a first layer of the integrated circuit design, and wherein the identified subset includes at least one signal net in a second layer of the integrated circuit design.

49. A computer-readable medium tangibly storing computer program instructions for performing steps of:

(A) identifying a first signal net in an integrated circuit design;

(B) identifying a plurality of second signal nets in the integrated circuit design;

(C) identifying a subset of the plurality of second signal nets that are closest to the first signal net by performing steps of:

(C)(1) sorting the plurality of second signal nets according to distances between the first signal net and the plurality of second signal nets to produce a sorted signal net list;

(C) (2) identifying a number NC; and (C) (3) identifying the first NC signal nets in the sorted signal net list as the subset of the plurality of second signal nets; and (D) notifying a user of the subset of the plurality of second signal nets.

50. The computer-readable medium of claim 49, wherein the computer program instructions for performing the step (A) comprise instructions for performing a step of:

(A)(1) identifying a first signal net being edited by the user using an integrated circuit design tool; and wherein the computer program instructions for performing the step (D) comprise instructions for performing a step of:

(D) (1) notifying the user of the plurality of second signal nets while the user is editing the first signal net.

51. The computer-readable medium of claim 50, wherein the computer program instructions for performing the step (D) (1) comprise instructions for performing a step of providing to the user a visual indication of the at least one second signal net.

52. The computer-readable medium of claim 51, wherein the computer program instructions for performing the step (D) (1) comprise instructions for performing a step of providing to the user a visual indication of coordinates on the first signal net, which are closest to the subset of the plurality of second signal nets.

53. The computer-readable medium of claim 49, the first signal net comprises a first plurality of signal nets, and wherein the computer program instructions further comprise instructions for performing the steps (A), (B), (C), and (D) for each of the first plurality of signal nets.

54. The computer-readable medium of claim 49, wherein the computer program instructions for performing the step (D) comprise instructions for performing a step of generating a report identifying the first signal net and the subset of the plurality of second signal nets.

55. The computer-readable medium of claim 54, wherein the first signal net comprises a first plurality of signal nets, and wherein the computer program instructions further comprises instructions for performing the steps (A), (B), (C), and (D) for each of the first plurality of signal nets.

56. The computer-readable medium of claim 49, wherein the integrated circuit design comprises a computer-implemented model of an integrated circuit tangibly stored in a computer-readable medium.

57. The computer-readable medium of claim 49, wherein the computer program instructions for performing the step (A) comprise instructions for performing a step of identifying the first signal net in a first layer of the integrated circuit design, and wherein the subset identified in the step (C) includes at least one signal net in a second layer of the integrated circuit design.

58. A computer-implemented method comprising steps of:

(A) identifying a first signal net, in an integrated circuit design, being edited by a user using an integrated circuit design tool;

(B) identifying a second signal net in the integrated circuit design;

(C) determining whether at least one portion of the second signal net is within a threshold distance of the first signal net;

(D) if it is determined that at least one portion of the second signal net is within the threshold distance of the first signal net, measuring the aggregate length along the first signal net that is within the threshold distance of the second signal net;

(E) determining whether the measured length is at least as great as a threshold length; and (F) notifying the user, while the user is editing the first signal net, that the second signal net is within the threshold distance of the first signal net if it is determined that the measured length is at least as great as the threshold length, by providing to the user a visual indication of coordinates on the first signal net which are within the threshold distance of the second signal net.

59. A computer-implemented system comprising:

first identification means for identifying a first signal net, in an integrated circuit design, being edited by a user using an integrated circuit design tool;

second identification means for identifying a second signal net in the integrated circuit design;

first determination means for determining whether at least one portion of the second signal net is within a threshold distance of the first signal net;

measurement means for measuring the aggregate length along the first signal net that is within the threshold distance of the second signal net if it is determined that at least one portion of the second signal net is within the threshold distance of the first signal net;

second determination means for determining whether the measured length is at least as great as a threshold length; and notification means for notifying the user, while the user is editing the first signal net, that the second signal net is within the threshold distance of the first signal net if it is determined that the measured length is at least as great as the threshold length, by providing to the user a visual indication of coordinates on the first signal net which are within the threshold distance of the second signal net.

60. A computer-readable medium tangibly embodying computer program instructions for performing steps of:

(A) identifying a first signal net, in an integrated circuit design, being edited by a user using an integrated circuit design tool;

(B) identifying a second signal net in the integrated circuit design;

(C) determining whether at least one portion of the second signal net is within a threshold distance of the first signal net;

(D) if it is determined that at least one portion of the second signal net is within the threshold distance of the first signal net, measuring the aggregate length along the first signal net that is within the threshold distance of the second signal net;

(E) determining whether the measured length is at least as great as a threshold length; and (F) notifying the user, while the user is editing the first signal net, that the second signal net is within the threshold distance of the first signal net if it is determined that the measured length is at least as great as the threshold length, by providing to the user a visual indication of coordinates on the first signal net which are within the threshold distance of the second signal net.

61. A computer-implemented method comprising steps of:

(A) identifying a first signal net, in an integrated circuit design, being edited by a user using an integrated circuit design tool;

(B) identifying a plurality of second signal nets in the integrated circuit design;

(C) identifying a subset of the plurality of second signal nets that are closest to the first signal net; and (D) notifying the user of the subset of the plurality of second signal nets while the user is editing the first signal net, by providing to the user a visual indication of coordinates on the first signal net which are closest to the subset of the plurality of second signal nets.

62. A computer-implemented method comprising steps of:

(A) identifying a first signal net in a first layer of an integrated circuit design;

(B) identifying a plurality of second signal nets in the integrated circuit design;

(C) identifying a subset of the plurality of second signal nets that are closest to the first signal net, the subset of the plurality of second signal nets including at least one signal net in a second layer of the integrated circuit design; and (D) notifying a user of the subset of the plurality of second signal nets.

63. A computer-implemented system comprising:

first identification means for identifying a first signal net, in an integrated circuit design, being edited by a user using an integrated circuit design tool;

second identification means for identifying a plurality of second signal nets in the integrated circuit design;

subset identification means for identifying a subset of the plurality of second signal nets that are closest to the first signal net; and notification means for notifying a user of the subset of the plurality of second signal nets while the user is editing the first signal net, by providing to the user a visual indication of coordinates on the first signal net which are closest to the subset of the plurality of second signal nets.

64. A computer-implemented system comprising:

first identification means for identifying a first signal net in a first layer of an integrated circuit design;

second identification means for identifying a plurality of second signal nets in the integrated circuit design;

subset identification means for identifying a subset of the plurality of second signal nets that are closest to the first signal net, the subset of the plurality of second signal nets including at least one signal net in a second layer of the integrated circuit design; and notification means for notifying a user of the subset of the plurality of second signal nets.

65. A computer-readable medium tangibly storing computer program instructions for performing steps of:

(A) identifying a first signal net, in an integrated circuit design, being edited by a user using an integrated circuit design tool;

(B) identifying a plurality of second signal nets in the integrated circuit design;

(C) identifying a subset of the plurality of second signal nets that are closest to the first signal net; and (D) notifying the user of the subset of the plurality of second signal nets while the user is editing the first signal net, by providing to the user a visual indication of coordinates on the first signal net which are closest to the subset of the plurality of second signal nets.

66. A computer-readable medium tangibly storing computer program instructions for performing steps of:

(A) identifying a first signal net in a first layer of an integrated circuit design;

(B) identifying a plurality of second signal nets in the integrated circuit design;

(C) identifying a subset of the plurality of second signal nets that are closest to the first signal net, the subset of the plurality of second signal nets including at least one signal, net in a second layer of the integrated circuit design; and (D) notifying a user of the subset of the plurality of second signal nets.

* * * * *